(12) United States Patent
Park et al.

(10) Patent No.: US 10,826,537 B2
(45) Date of Patent: Nov. 3, 2020

(54) BIT INTERLEAVER FOR LOW-DENSITY PARITY CHECK CODEWORD HAVING LENGTH OF 64800 AND CODE RATE OF 4/15 AND QUADRATURE PHASE SHIFT KEYING, AND BIT INTERLEAVING METHOD USING SAME

(71) Applicant: ELECTRONICS AND TELECOMMUNICATIONS RESEARCH INSTITUTE, Daejeon (KR)

(72) Inventors: Sung-Ik Park, Daejeon (KR);
Sun-Hyoung Kwon, Daejeon (KR);
Jae-Young Lee, Daejeon (KR);
Heung-Mook Kim, Daejeon (KR);
Nam-Ho Hur, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/400,988

(22) Filed: May 1, 2019

(65) Prior Publication Data
US 2019/0260395 A1 Aug. 22, 2019

Related U.S. Application Data

(63) Continuation of application No. 15/402,066, filed on Jan. 9, 2017, now Pat. No. 10,326,476, which is a (Continued)

(30) Foreign Application Priority Data

Jan. 20, 2015 (KR) .................... 10-2015-0009382

(51) Int. Cl.
*H03M 13/00* (2006.01)
*H03M 13/27* (2006.01)
(Continued)

(52) U.S. Cl.
CPC ... *H03M 13/2792* (2013.01); *H03M 13/1102* (2013.01); *H03M 13/1165* (2013.01);
(Continued)

(58) Field of Classification Search
CPC . H04N 21/236; H04L 27/2627; H04L 1/0057; H04L 27/2647; H04L 27/2655;
(Continued)

(56) References Cited

U.S. PATENT DOCUMENTS 10,411,739 B2   9/2019  Jeong et al.
2004/0086059 A1 5/2004  Eroz et al.
(Continued)

FOREIGN PATENT DOCUMENTS

CA      2973181 A1     7/2016
EP      2525495 A1    11/2012
KR   1020150005426 A   1/2015

*Primary Examiner* — Guerrier Merant

(57) ABSTRACT

A bit interleaver, a bit-interleaved coded modulation (BICM) device and a bit interleaving method are disclosed herein. The bit interleaver includes a first memory, a processor, and a second memory. The first memory stores a low-density parity check (LDPC) codeword having a length of 64800 and a code rate of 4/15. The processor generates an interleaved codeword by interleaving the LDPC codeword on a bit group basis. The size of the bit group corresponds to a parallel factor of the LDPC codeword. The second memory provides the interleaved codeword to a modulator for quadrature phase shift keying (QPSK) modulation.

3 Claims, 6 Drawing Sheets

Related U.S. Application Data continuation of application No. 14/606,987, filed on Jan. 27, 2015, now Pat. No. 9,577,790.

(51) Int. Cl.
*H04L 1/00* (2006.01)
*H03M 13/11* (2006.01)
*H03M 13/25* (2006.01)

(52) U.S. Cl.
CPC ..... *H03M 13/255* (2013.01); *H03M 13/2778* (2013.01); *H03M 13/616* (2013.01); *H03M 13/6552* (2013.01); *H04L 1/0041* (2013.01); *H04L 1/0057* (2013.01); *H04L 1/0058* (2013.01); *H04L 1/0071* (2013.01); *H04L 1/0076* (2013.01); *H04L 2001/0093* (2013.01)

(58) Field of Classification Search
CPC ....... H04L 27/36; H04L 27/20; H04L 1/0071; H04L 27/3416; G06F 11/1076; H03M 13/1102; H03M 13/1165; H03M 13/255; H03M 13/618; H03M 13/2778; H03M 13/27; H03M 13/09; H03M 13/2792; H03M 13/036; H03M 13/616; H03M 13/116; H03M 13/1185; H03M 13/6555; H03M 13/2707; H03M 13/1134; H03M 13/1191; H03M 13/611; H03M 13/2906; H03M 13/1505; H03M 13/112; H03M 13/1137; H03M 13/155; G06N 7/005
See application file for complete search history.

(56) References Cited

U.S. PATENT DOCUMENTS

| | | |
|---|---|---|
| 2011/0075710 A1 | 3/2011 | Park et al. |
| 2011/0167317 A1 | 7/2011 | Kim et al. |
| 2013/0254617 A1 | 9/2013 | Shinohara et al. |
| 2016/0233889 A1* | 8/2016 | Shinohara ......... H03M 13/2792 |

* cited by examiner

BIT INTERLEAVER FOR LOW-DENSITY PARITY CHECK CODEWORD HAVING LENGTH OF 64800 AND CODE RATE OF 4/15 AND QUADRATURE PHASE SHIFT KEYING, AND BIT INTERLEAVING METHOD USING SAME

CROSS-REFERENCE TO RELATED APPLICATIONS

This application is a continuation of U.S. patent application Ser. No. 15/402,066, filed Jan. 9, 2017, which is a continuation of U.S. patent application Ser. No. 14/606,987, filed Jan. 27, 2015, now U.S. Pat. No. 9,577,790, which claims the benefit of Korean Patent Application No. 10-2015-0009382, filed Jan. 20, 2015, which is hereby incorporated by reference herein in its entirety.

BACKGROUND

1. Technical Field

The present disclosure relates generally to an interleaver and, more particularly, to a bit interleaver that is capable of distributing burst errors occurring in a digital broadcast channel.

2. Description of the Related Art

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

However, in spite of those advantages, BICM suffers from the rapid degradation of performance unless burst errors occurring in a channel are appropriately distributed via the bit-by-bit interleaver. Accordingly, the bit-by-bit interleaver used in BICM should be designed to be optimized for the modulation order or the length and code rate of the error correction code.

SUMMARY

At least one embodiment of the present invention is directed to the provision of an intra-BICM bit interleaver that can effectively distribute burst errors occurring in a broadcasting system channel.

At least one embodiment of the present invention is directed to the provision of a bit interleaver that is optimized for an LDPC coder having a length of 64800 and a code rate of 4/15 and a quadrature phase shift keying (QPSK) modulator performing QPSK modulation and, thus, can be applied to next-generation broadcasting systems, such as ATSC 3.0.

In accordance with an aspect of the present invention, there is provided a bit interleaver, including a first memory configured to store a low-density parity check (LDPC) codeword having a length of 64800 and a code rate of 4/15; a processor configured to generate an interleaved codeword by interleaving the LDPC codeword on a bit group basis, the size of the bit group corresponding to a parallel factor of the LDPC codeword; and a second memory configured to provide the interleaved codeword to a modulator for QPSK modulation.

The parallel factor may be 360, and each of the bit groups may include 360 bits.

The LDPC codeword may be represented by $(u_0, u_1, \ldots, u_{N_{ldpc}-1})$ (where $N_{ldpc}$ is 64800), and may be divided into 180 bit groups each including 360 bits, as in the following equation:

$$X_j = \{u_k | 360 \times j \le 360 \times (j+1), 0 \le k < N_{ldpc}\} \text{ for } 0 \le j < N_{group}$$

where $X_j$ is an j-th bit group, $N_{ldpc}$ is 64800, and $N_{group}$ is 180.

The interleaving may be performed using the following equation using permutation order:

$$Y_j = X_{\pi(j)} \ 0 \le j \le N_{group}$$

where $X_j$ is the j-th bit group, $Y_j$ is an interleaved j-th bit group, and $\pi(j)$ is a permutation order for bit group-based interleaving (bit group-unit interleaving).

The permutation order may correspond to an interleaving sequence represented by the following equation:

interleaving sequence={141 86 22 20 176 21 37 82
6 122 130 40 62 44 24 117 8 145 36 79 172
149 127 163 9 160 73 100 16 153 124 110 49
154 152 4 168 54 177 158 113 57 2 102 161
147 18 103 1 41 104 144 39 105 131 77 69
108 159 61 45 156 0 83 157 119 112 118 92
109 75 67 142 96 51 139 31 166 179 89 167
23 34 60 93 165 128 90 19 33 70 173 174 129
55 98 88 97 146 123 84 111 132 71 140 136
10 115 63 46 42 50 138 81 59 53 15 52 72 164
150 29 17 91 101 14 38 35 66 64 7 125 151 56
126 171 68 121 28 65 106 78 47 143 12 169
120 27 74 48 133 43 116 137 94 3 25 134 13
107 162 32 99 85 175 80 170 5 135 178 11 26
76 95 87 155 58 30 148 114}

In accordance with another aspect of the present invention, there is provided a bit interleaving method, including storing an LDPC codeword having a length of 64800 and a code rate of 4/15; generating an interleaved codeword by interleaving the LDPC codeword on a bit group basis corresponding to the parallel factor of the LDPC codeword; and outputting the interleaved codeword to a modulator for QPSK modulation.

In accordance with still another aspect of the present invention, there is provided a BICM device, including an error-correction coder configured to output an LDPC codeword having a length of 64800 and a code rate of 4/15; a bit interleaver configured to interleave the LDPC codeword on a bit group basis corresponding to the parallel factor of the LDPC codeword and output the interleaved codeword; and a modulator configured to perform QPSK modulation on the interleaved codeword.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
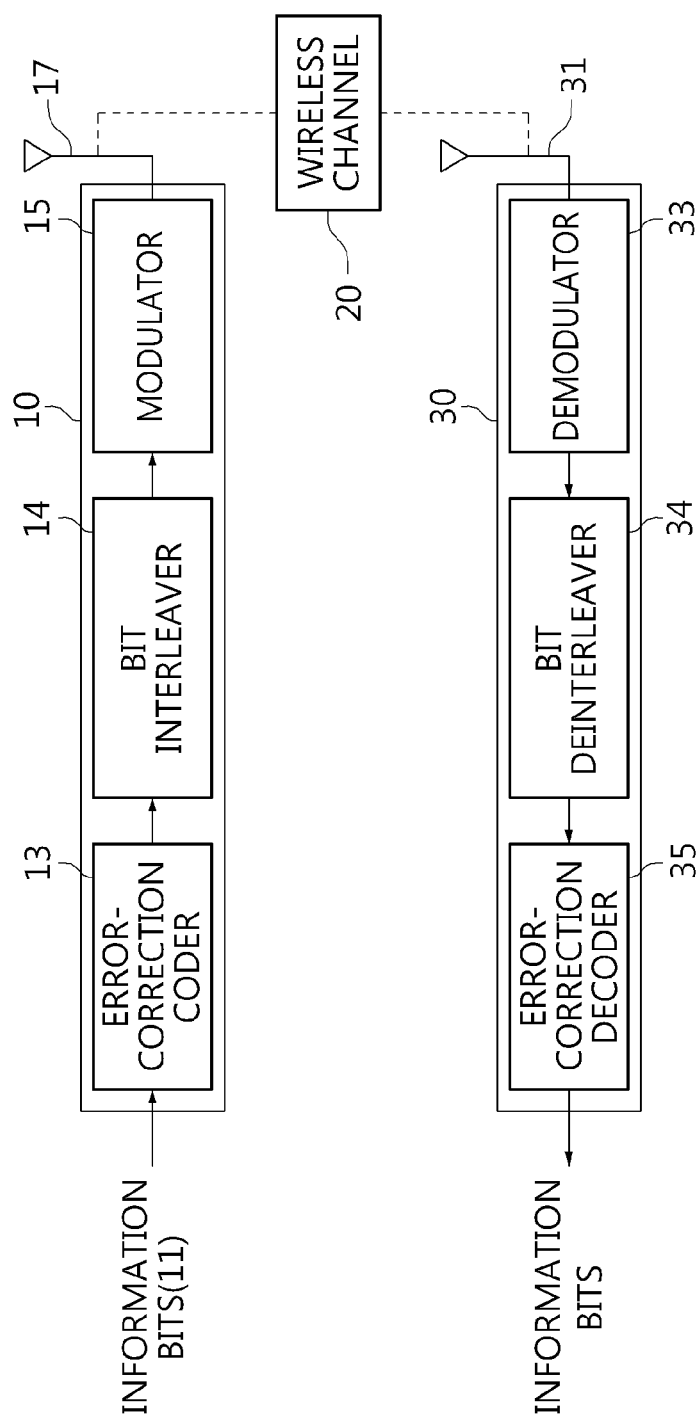
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a BICM device 10 and a BICM reception device 30 communicate with each other over a wireless channel 20.

The BICM device 10 generates an n-bit codeword by encoding k information bits 11 using an error-correction coder 13. In this case, the error-correction coder 13 may be an LDPC coder or a Turbo coder.

The codeword is interleaved by a bit interleaver 14, and thus the interleaved codeword is generated.

In this case, the interleaving may be performed on a bit group basis (by a unit of a bit group). In this case, the error-correction coder 13 may be an LDPC coder having a length of 64800 and a code rate of 4/15. A codeword having a length of 64800 may be divided into a total of 180 bit groups. Each of the bit groups may include 360 bits, i.e., the parallel factor of an LDPC codeword.

In this case, the interleaving may be performed on a bit group basis (by a unit of a bit group) in accordance with an interleaving sequence, which will be described later.

In this case, the bit interleaver 14 prevents the performance of error correction code from being degraded by effectively distributing burst errors occurring in a channel. In this case, the bit interleaver 14 may be separately designed in accordance with the length and code rate of the error correction code and the modulation order.

The interleaved codeword is modulated by a modulator 15, and is then transmitted via an antenna 17. In this case, the modulator 15 may be a quadrature phase shift keying (QPSK) modulator. In this case, the modulator 15 is based on a concept including a symbol mapping device. In this case, the modulator 15 may be a uniform modulator, such as a quadrature amplitude modulation (QAM) modulator, or a non-uniform modulator.

The signal transmitted via the wireless channel 20 is received via the antenna 31 of the BICM reception device 30, and, in the BICM reception device 30, is subjected to a process reverse to the process in the BICM device 10. That is, the received data is demodulated by a demodulator 33, is deinterleaved by a bit deinterleaver 34, and is then decoded by an error correction decoder 35, thereby finally restoring the information bits.

It will be apparent to those skilled in the art that the above-described transmission and reception processes have been described within a minimum range required for a description of the features of the present invention and various processes required for data transmission may be added.

Figure 2:
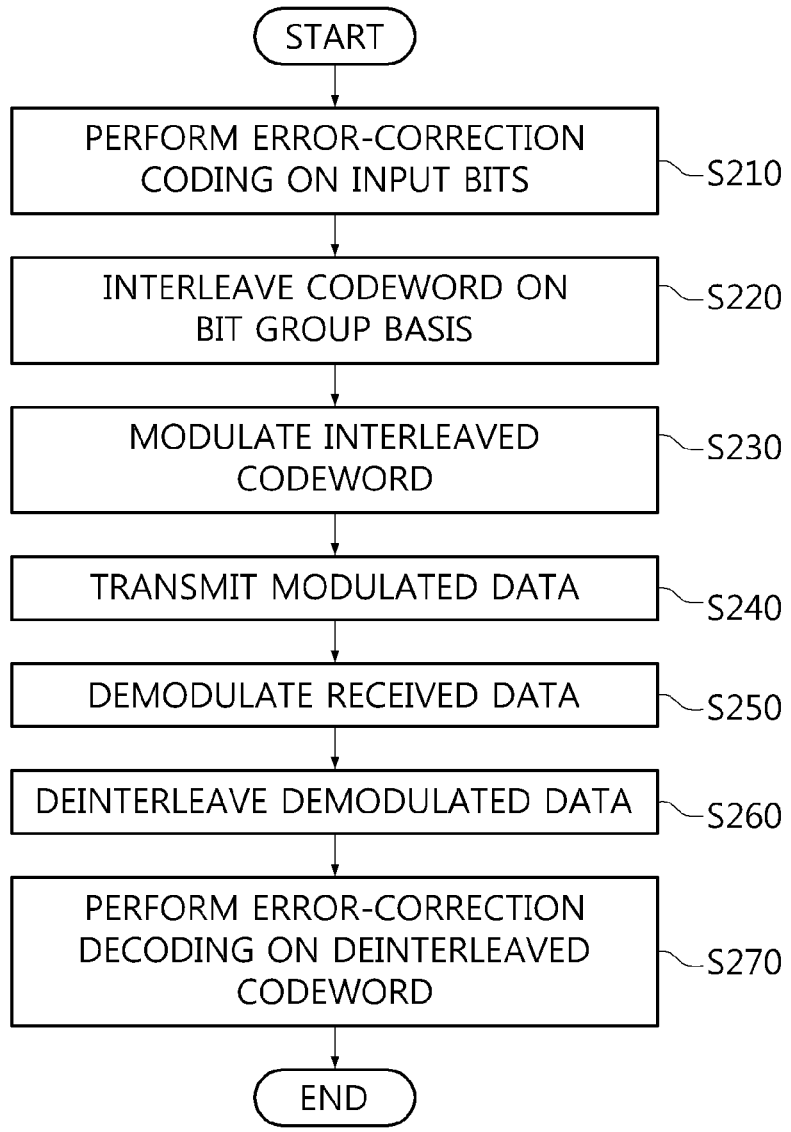
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to error-correction coding at step S210.

That is, at step S210, an n-bit codeword is generated by encoding k information bits using the error-correction coder.

In this case, step S210 may be performed as in an LDPC encoding method, which will be described later.

Furthermore, in the broadcast signal transmission and reception method, an interleaved codeword is generated by interleaving the n-bit codeword on a bit group basis at step S220.

In this case, the n-bit codeword may be an LDPC codeword having a length of 64800 and a code rate of 4/15. The codeword having a length of 64800 may be divided into a total of 180 bit groups. Each of the bit groups may include 360 bits corresponding to the parallel factors of an LDPC codeword.

In this case, the interleaving may be performed on a bit group basis (by a unit of a bit group) in accordance with an interleaving sequence, which will be described later.

Furthermore, in the broadcast signal transmission and reception method, the encoded data is modulated at step S230.

That is, at step S230, the interleaved codeword is modulated using the modulator.

In this case, the modulator may be a QPSK modulator. In this case, the modulator is based on a concept including a symbol mapping device. In this case, the modulator may be a uniform modulator, such as a QAM modulator, or a non-uniform modulator.

Furthermore, in the broadcast signal transmission and reception method, the modulated data is transmitted at step S240.

That is, at step S240, the modulated codeword is transmitted over the wireless channel via the antenna.

Furthermore, in the broadcast signal transmission and reception method, the received data is demodulated at step S250.

That is, at step S250, the signal transmitted over the wireless channel is received via the antenna of the receiver, and the received data is demodulated using the demodulator.

Furthermore, in the broadcast signal transmission and reception method, the demodulated data is deinterleaved at step S260. In this case, the deinterleaving of step S260 may be reverse to the operation of step S220.

Furthermore, in the broadcast signal transmission and reception method, the deinterleaved codeword is subjected to error correction decoding at step S270.

That is, at step S270, the information bits are finally restored by performing error correction decoding using the error correction decoder of the receiver.

In this case, step S270 corresponds to a process reverse to that of an LDPC encoding method, which will be described later.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \ldots & J^{a_{1n}} \\ J^{a_{21}} & J^{a_{22}} & \ldots & J^{a_{2n}} \\ \vdots & \vdots & \ddots & \vdots \\ J^{a_{m1}} & J^{a_{m2}} & \ldots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 1 \\ 1 & 0 & 0 & \ldots & 0 \end{bmatrix} \quad (2)$$

Furthermore, $J^i$ is obtained by shifting an L×L identity matrix $I(J^0)$ to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
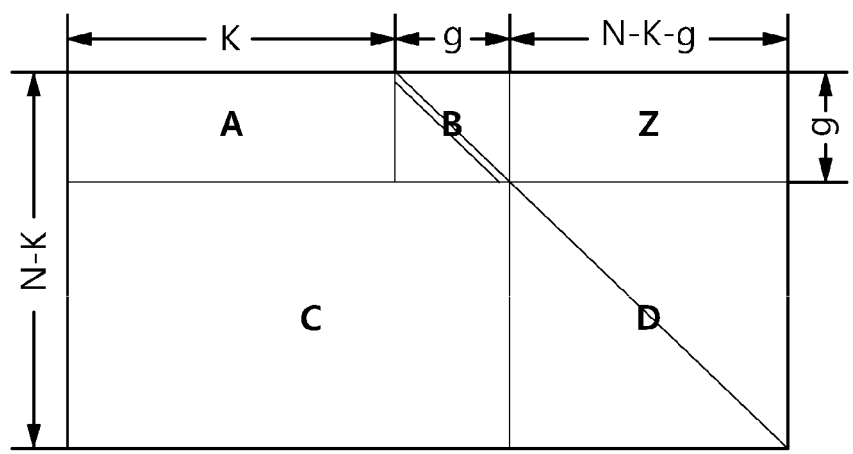
FIG. 3 is a diagram illustrating the structure of a parity check matrix (PCM) corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \ldots & 0 & 0 & 0 \\ I_{L \times L} & I_{L \times L} & 0 & \ldots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \ldots & I_{L \times L} & I_{L \times L} & 0 \\ 0 & 0 & 0 & \ldots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 4/15 and the length of a codeword is 64800, as illustrated in the following Table 1. That is, the present invention proposes an LDPC code that is designed to receive information having a length of 17280 and generate an LDPC codeword having a length of 64800.

Table 1 illustrates the sizes of the matrices A, B, C, D and Z of the QC-LDPC code according to the present invention:

TABLE 1

| Code | | Sizes | | | | |
|---|---|---|---|---|---|---|
| rate | Length | A | B | C | D | Z |
| 4/15 | 64800 | 1800 × 17280 | 1800 × 1800 | 45720 × 19080 | 45720 × 45720 | 1800 × 45720 |

The newly designed LDPC code may be represented in the form of a sequence (progression), an equivalent relationship is established between the sequence and matrix (parity bit check matrix), and the sequence may be represented, as follows:

Sequence Table

1st row: 276 1754 1780 3597 8549 15196 26305 27003 33883 37189 41042 41849 42356
2nd row: 730 873 927 9310 9867 17594 21969 25106 25922 31167 35434 37742 45866
3rd row: 925 1202 1564 2575 2831 2951 5193 13096 18363 20592 33786 34090 40900
4th row: 973 1045 1071 8545 8980 11983 18649 21323 22789 22843 26821 36720 37856
5th row: 402 1038 1689 2466 2893 13474 15710 24137 29709 30451 35568 35966 46436
6th row: 263 271 395 5089 5645 15488 16314 28778 29729 34350 34533 39608 45371
7th row: 387 1059 1306 1955 6990 20001 24606 28167 33802 35181 38481 38688 45140
8th row: 53 851 1750 3493 11415 18882 20244 23411 28715 30722 36487 38019 45416

Sequence Table
-continued

9th row: 810 1044 1772 3906 5832 16793 17333 17910 23946 29650 34190 40673 45828
10th row: 97 491 948 12156 13788 24970 33774 37539 39750 39820 41195 46464 46820
11st row: 192 899 1283 3732 7310 13637 13810 19005 24227 26772 31273 37665 44005
12th row: 424 531 1300 4860 8983 10137 16323 16888 17933 22458 26917 27835 37931
13th row: 130 279 731 3024 6378 18838 19746 21007 22825 23109 28644 32048 34667
14th row: 938 1041 1482 9589 10065 11535 17477 25816 27966 35022 35025 42536
15th row: 170 454 1312 5326 6765 23408 24090 26072 33037 38088 42985 46413
16th row: 220 804 843 2921 4841 7760 8303 11259 21058 21276 34346 37604
17th row: 676 713 832 11937 12006 12309 16329 26438 34214 37471 38179 42420
18th row: 714 931 1580 6837 9824 11257 15556 26730 32053 34461 35889 45821
19th row: 28 1097 1340 8767 9406 17253 29558 32857 37856 38593 41781 47101
20th row: 158 722 754 14489 23851 28160 30371 30579 34963 44216 46462 47463
21st row: 833 1326 1332 7032 9566 11011 21424 26827 29789 31699 32876 37498
22nd row: 251 504 1075 4470 7736 11242 20397 32719 34453 36571 40344 46341
23rd row: 330 581 868 15168 20265 26354 33624 35134 38609 44965 45209 46909
24th row: 729 1643 1732 3946 4912 9615 19699 30993 33658 38712 39424 46799
25th row: 546 982 1274 9264 11017 11868 15674 16277 19204 28606 39063 43331
26th row: 73 1160 1196 4334 12560 13583 14703 18270 18719 19327 38985 46779
27th row: 1147 1625 1759 3767 5912 11599 18561 19330 29619 33671 43346 44098
28th row: 104 1507 1586 9387 17890 23532 27008 27861 30966 33579 35541 39801
29th row: 1700 1746 1793 4941 7814 13746 20375 27441 30262 30392 35385 42848
30th row: 183 555 1029 3090 5412 8148 19662 23312 23933 28179 29962 35514
31st row: 891 908 1127 2827 4077 4376 4570 26923 27456 33699 43431 46071
32nd row: 404 1110 1782 6003 14452 19247 26998 30137 31404 31624 46621 47366
33rd row: 886 1627 1704 8193 8980 9648 10928 16267 19774 35111 38545 44735
34th row: 268 380 1214 4797 5168 9109 9288 17992 21309 33210 36210 41429
35th row: 572 1121 1165 6944 7114 20978 23540 25863 26190 26365 41521 44690
36th row: 18 185 496 5885 6165 20468 23895 24745 31226 33680 37665 38587
37th row: 289 527 1118 11275 12015 18088 22805 24679 28262 30160 34892 43212
38th row: 658 926 1589 7634 16231 22193 25320 26057 26512 27498 29472 34219
39th row: 337 801 1525 2023 3512 16031 26911 32719 35620 39035 43779 44316
40th row: 248 534 670 6217 11430 24090 26509 28712 33073 33912 38048 39813
41st row: 82 1556 1575 7879 7892 14714 22404 22773 25531 34170 38203 38254
42nd row: 247 313 1224 3694 14304 24033 26394 28101 37455 37859 38997 41344
43rd row: 790 887 1418 2811 3288 9049 9704 13303 14262 38149 40109 40477
44th row: 1310 1384 1471 3716 8250 25371 26329 26997 30138 40842 41041 44921
45th row: 86 288 367 1860 8713 18211 22628 22811 28342 28463 40415 45845
46th row: 719 1438 1741 8258 10797 29270 29404 32096 34433 34616 36030 45597
47th row: 215 1182 1364 8146 9949 10498 18603 19304 19803 23685 43304 45121
48th row: 1243 1496 1537 8484 8851 16589 17665 20152 24283 28993 34274 39795
49th row: 6320 6785 15841 16309 20512 25804 27421 28941 43871 44647
50th row: 2207 2713 4450 12217 16506 21188 23933 28789 38099 42392
51st row: 14064 14307 14599 14866 17540 18881 21065 25823 30341 36963
52nd row: 14259 14396 17037 26769 29219 29319 31689 33013 35631 37319
53rd row: 7798 10495 12868 14298 17221 23344 31908 39809 41001 41965

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j=0 \text{ for } j=0,1\ldots,M_1+M_2-1 \quad (4)$$

First information bit $\lambda_0$ is accumulated at parity bit addresses specified in the 1st row of the sequence of the Sequence Table. For example, in an LDPC code having a length of 64800 and a code rate of 4/15, an accumulation process is as follows:

$p_{276} = p_{276} \oplus \lambda_0$ $p_{1754} = p_{1754} \oplus \lambda_0$ $p_{1780} = p_{1780} \oplus \lambda_0$ $p_{3597} = p_{3597} \oplus \lambda_0$ $p_{8549} = p_{8549} \oplus \lambda_0$
$p_{15196} = p_{15196} \oplus \lambda_0$ $p_{26305} = p_{26305} \oplus \lambda_0$ $p_{27003} = p_{27003} \oplus \lambda_0$ $p_{33883} = p_{33883} \oplus \lambda_0$
$p_{37189} = p_{37189} \oplus \lambda_0$ $p_{41042} = p_{41042} \oplus \lambda_0$ $p_{41849} = p_{41849} \oplus \lambda_0$ $p_{42356} = p_{42356} \oplus \lambda_0$ where the addition $\oplus$ occurs in GF(2).

The subsequent L−1 information bits, that is, $\lambda_m$, m=1, 2, ..., L−1, are accumulated at parity bit addresses that are calculated by the following Equation 5:

$$(x+m \times Q_1) \bmod M_1 \text{ if } x<M_1$$

$$M_1+\{(x+M_1+m \times Q_2) \bmod M_2\} \text{ if } x \geq M_1 \quad (5)$$

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and L=360. Furthermore, $Q_1$ and $Q_2$ are defined in the following Table 2. For example, for an LDPC code having a length of 64800 and a code rate of 4/15, $M_1$=1800, $Q_1$=5, $M_2$=45720, $Q_2$=127 and L=360, and the following operations are performed on the second bit $\lambda_1$ using Equation 5:

$p_{281} = p_{281} \oplus \lambda_1$ $p_{1759} = p_{1759} \oplus \lambda_1$ $p_{1785} = p_{1785} \oplus \lambda_1$ $p_{3724} = p_{3724} \oplus \lambda_1$ $p_{8676} = p_{8676} \oplus \lambda_1$
$p_{15323} = p_{15323} \oplus \lambda_1$ $p_{26432} = p_{26432} \oplus \lambda_1$ $p_{27130} = p_{27130} \oplus \lambda_1$ $p_{34010} = p_{34010} \oplus \lambda_1$
$p_{37316} = p_{37316} \oplus \lambda_1$ $p_{41169} = p_{41169} \oplus \lambda_1$ $p_{41976} = p_{41976} \oplus \lambda_1$ $p_{42483} = p_{42483} \oplus \lambda_1$ Table 2 illustrates the sizes of $M_1$, $Q_1$, $M_2$ and $Q_2$ of the designed QC-LDPC code:

TABLE 2

| | | Sizes | | |
|---|---|---|---|---|
| Code rate | Length | $M_1$ | $M_2$ | $Q_1$ | $Q_2$ |
| 4/15 | 64800 | 1800 | 45720 | 5 | 127 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i = p_i \oplus p_{i-1} \text{ for } i=0,1,\ldots,M_1-1 \quad (6)$$

Thereafter, when a parity interleaving operation, such as that of the following Equation 7, is performed, parity bits corresponding to the dual diagonal matrix B are generated:

$$\lambda_{K+L \cdot t+s} = p_{Q_1 \cdot s+t} \text{ for } 0 \le s < L, 0 \le t < Q_1 \quad (7)$$

When the parity bits corresponding to the dual diagonal matrix B have been generated using K information bits $\lambda_0$, $\lambda_1$, ..., $\lambda_{K-1}$, parity bits corresponding to the identity matrix D are generated using the $M_1$ generated parity bits $\lambda_K$, $\lambda_{K+1}$, ..., $\lambda_{K+M_1-1}$.

For all groups composed of L information bits from $\lambda_K$ to $\lambda_{K-M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\Delta_{K+M_1-1}$ have been exhausted, parity bits corresponding to the identity matrix D are generated:

$$\lambda_{K+M_1+L \cdot t+s} = p_{M_1+Q_2 \cdot s+t} \text{ for } 0 \le s < L, 0 \le t < Q_2 \quad (8)$$

Figure 4:
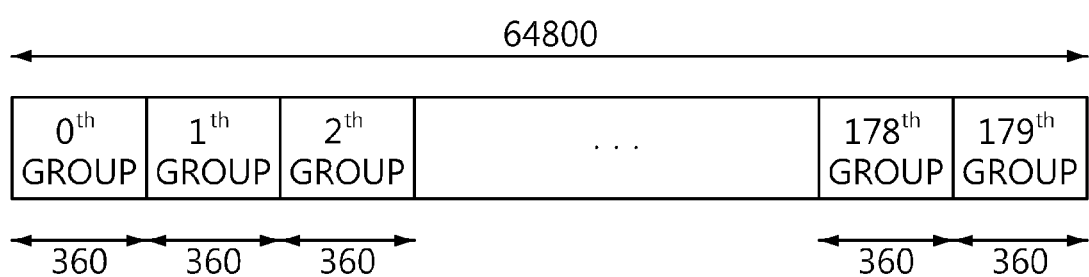
FIG. 4 is a diagram illustrating the bit groups of an LDPC codeword having a length of 64800.

FIG. 4 is a diagram illustrating the bit groups of an LDPC codeword having a length of 64800.

Referring to FIG. 4, it can be seen that an LDPC codeword having a length of 64800 is divided into 180 bit groups (a 0th group to a 179th group).

In this case, 360 may be the parallel factor (PF) of the LDPC codeword. That is, since the PF is 360, the LDPC codeword having a length of 64800 is divided into 180 bit groups, as illustrated in FIG. 4, and each of the bit groups includes 360 bits.

Figure 5:
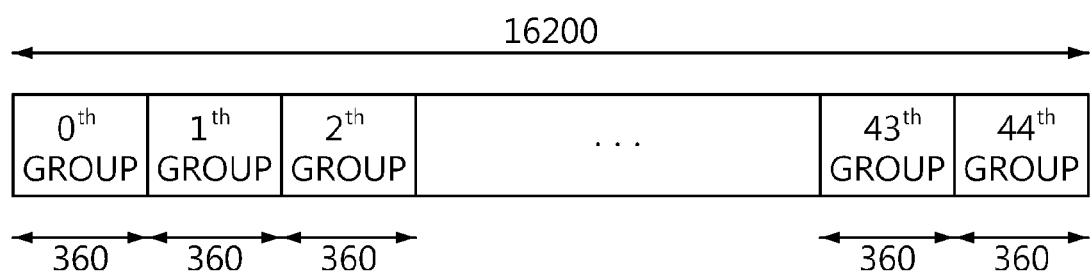
FIG. 5 is a diagram illustrating the bit groups of an LDPC codeword having a length of 16200.

FIG. 5 is a diagram illustrating the bit groups of an LDPC codeword having a length of 16200.

Referring to FIG. 5, it can be seen that an LDPC codeword having a length of 16200 is divided into 45 bit groups (a 0th group to a 44th group).

In this case, 360 may be the parallel factor (PF) of the LDPC codeword. That is, since the PF is 360, the LDPC codeword having a length of 16200 is divided into 45 bit groups, as illustrated in FIG. 5, and each of the bit groups includes 360 bits.

Figure 6:
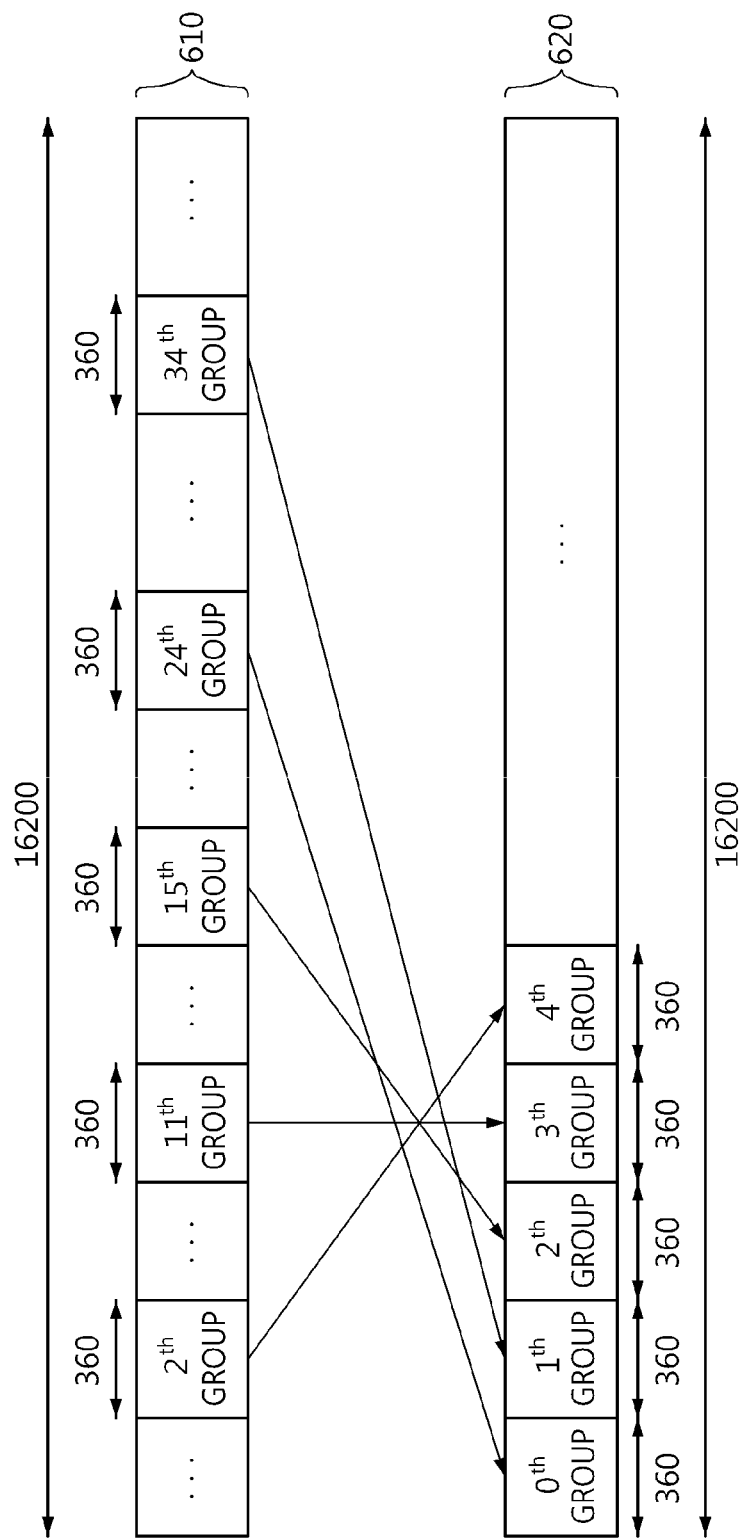
FIG. 6 is a diagram illustrating interleaving that is performed on a bit group basis in accordance with an interleaving sequence.

FIG. 6 is a diagram illustrating interleaving that is performed on a bit group basis in accordance with an interleaving sequence.

Referring to FIG. 6, it can be seen that interleaving is performed by changing the order of bit groups by a designed interleaving sequence.

For example, it is assumed that an interleaving sequence for an LDPC codeword having a length of 16200 is as follows:

interleaving sequence={24 34 15 11 2 28 17 25 5 38 19 13 6 39 1 14 33 37 29 12 42 31 30 32 36 40 26 35 44 4 16 8 20 43 21 7 0 18 23 3 10 41 9 27 22}

Then, the order of the bit groups of the LDPC codeword illustrated in FIG. 4 is changed into that illustrated in FIG. 6 by the interleaving sequence.

That is, it can be seen that each of the LDPC codeword 610 and the interleaved codeword 620 includes 45 bit groups, and it can be also seen that, by the interleaving sequence, the 24th bit group of the LDPC codeword 610 is changed into the 0th bit group of the interleaved LDPC codeword 620, the 34th bit group of the LDPC codeword 610 is changed into the 1st bit group of the interleaved LDPC codeword 620, the 15th bit group of the LDPC codeword 610 is changed into the 2nd bit group of the interleaved LDPC codeword 620, and the 11st bit group of the LDPC codeword 610 is changed into the 3rd bit group of the interleaved LDPC codeword 620, and the 2nd bit group of the LDPC codeword 610 is changed into the 4th bit group of the interleaved LDPC codeword 620.

An LDPC codeword $(u_0, u_1, \ldots, u_{N_{ldpc}-1})$ having a length of $N_{ldpc}$ is divided into $N_{group}=N_{ldpc}/360$ bit groups, as in Equation 9 below:

$$X_j = \{u_k | 360 \times j \le k < 360 \times (j+1), 0 \le k < N_{ldpc}\} \text{ for}$$
$$0 \le j < N_{group} \quad (9)$$

where $X_j$ is an j-th bit group, and each $X_j$ is composed of 360 bits.

The LDPC codeword divided into the bit groups is interleaved, as in Equation 10 below:

$$Y_j = X_{\pi(j)} \quad 0 \le j \le N_{group} \quad (10)$$

where $Y_j$ is an interleaved j-th bit group, and $\pi(j)$ is a permutation order for bit group-based interleaving (bit group-unit interleaving). The permutation order corresponds to the interleaving sequence of Equation 11 below:

interleaving sequence={141 86 22 20 176 21 37 82 6 122 130 40 62 44 24 117 8 145 36 79 172 149 127 163 9 160 73 100 16 153 124 110 49 154 152 4 168 54 177 158 113 57 2 102 161 147 18 103 1 41 104 144 39 105 131 77 69

108 159 61 45 156 0 83 157 119 112 118 92
109 75 67 142 96 51 139 31 166 179 89 167
23 34 60 93 165 128 90 19 33 70 173 174 129
55 98 88 97 146 123 84 111 132 71 140 136
10 115 63 46 42 50 138 81 59 53 15 52 72 164
150 29 17 91 101 14 38 35 66 64 7 125 151 56
126 171 68 121 28 65 106 78 47 143 12 169
120 27 74 48 133 43 116 137 94 3 25 134 13
107 162 32 99 85 175 80 170 5 135 178 11 26
76 95 87 155 58 30 148 114}   (11)

That is, when each of the codeword and the interleaved codeword includes 180 bit groups ranging from a 0th bit group to a 179th bit group, the interleaving sequence of Equation 11 means that the 141st bit group of the codeword becomes the 0th bit group of the interleaved codeword, the 86th bit group of the codeword becomes the 1st bit group of the interleaved codeword, the 22rd bit group of the codeword becomes the 2nd bit group of the interleaved codeword, the 20th bit group of the codeword becomes the 3rd bit group of the interleaved codeword, . . . , the 148th bit group of the codeword becomes the 178th bit group of the interleaved codeword, and the 114th bit group of the codeword becomes the 179th bit group of the interleaved codeword.

In particular, the interleaving sequence of Equation 11 has been optimized for a case where QPSK modulation is employed and an LDPC coder having a length of 64800 and a code rate of 4/15 is used.

Figure 7:
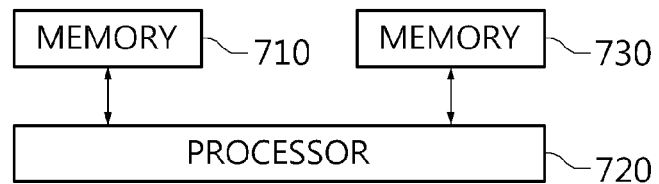
FIG. 7 is a block diagram illustrating a bit interleaver according to an embodiment of the present invention.

FIG. 7 is a block diagram illustrating a bit interleaver according to an embodiment of the present invention.

Referring to FIG. 7, the bit interleaver according to the present embodiment includes memories 710 and 730 and a processor 720.

The memory 710 stores an LDPC codeword having a length of 64800 and a code rate of 4/15.

The processor 720 generates an interleaved codeword by interleaving the LDPC codeword on a bit group basis corresponding to the parallel factor of the LDPC codeword.

In this case, the parallel factor may be 360. In this case, each of the bit groups may include 360 bits.

In this case, the LDPC codeword may be divided into 180 bit groups, as in Equation 9.

In this case, the interleaving may be performed using Equation 10 using permutation order.

In this case, the permutation order may correspond to the interleaving sequence represented by Equation 11.

The memory 730 provides the interleaved codeword to a modulator for QPSK modulation.

The memories 710 and 730 may correspond to various types of hardware for storing a set of bits, and may correspond to a data structure, such as an array, a list, a stack, a queue or the like.

In this case, the memories 710 and 730 may not be physically separate devices, but may correspond to different addresses of a physically single device. That is, the memories 710 and 730 are not physically distinguished from each other, but are merely logically distinguished from each other.

The error-correction coder 13 illustrated in FIG. 1 may be implemented in the same structure as in FIG. 7.

That is, the error-correction coder may include memories and a processor. In this case, the first memory is a memory that stores an LDPC codeword having a length of 64800 and a code rate of 4/15, and a second memory is a memory that is initialized to 0.

The memories may correspond to $\lambda_i$ (i=0, 1, . . . , N−1) and $P_j$(j=0, 1, . . . , $M_1+M_2-1$), respectively.

The processor may generate an LDPC codeword corresponding to information bits by performing accumulation with respect to the memory using a sequence corresponding to a parity check matrix (PCM).

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 17280 (=K), a first parity part $\lambda_K$, $\lambda_{K+1}, \ldots, \Delta_{K+M_1-1}$ corresponding to a dual diagonal matrix included in the PCM and having a length of 1800 (=$M_1$=g), and a second parity part $\lambda_{K+M_1}, \lambda_{K+M_1+1}, \ldots, \lambda_{K+M_1+M_2-1}$ corresponding to an identity matrix included in the PCM and having a length of 45720 (=$M_2$).

In this case, the sequence may have a number of rows equal to the sum (17280/360+1800/360=53) of a value obtained by dividing the length of the systematic part, i.e., 17280, by a CPM size L corresponding to the PCM, i.e., 360, and a value obtained by dividing the length $M_1$ of the first parity part, i.e., 1800, by 360.

As described above, the sequence may be represented by the above Sequence Table.

In this case, the second memory may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses, specified in respective rows of the sequence, with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part may be generated by performing parity interleaving using the first memory and the second memory, as described in conjunction with Equation 7.

In this case, the second parity part $\lambda_K, \lambda_{K+1}, \ldots \lambda_{K+M_1-1}$ may be generated by performing parity interleaving using the first memory and the second memory after generating the first parity part $\lambda_K, \lambda_{K+1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 8:
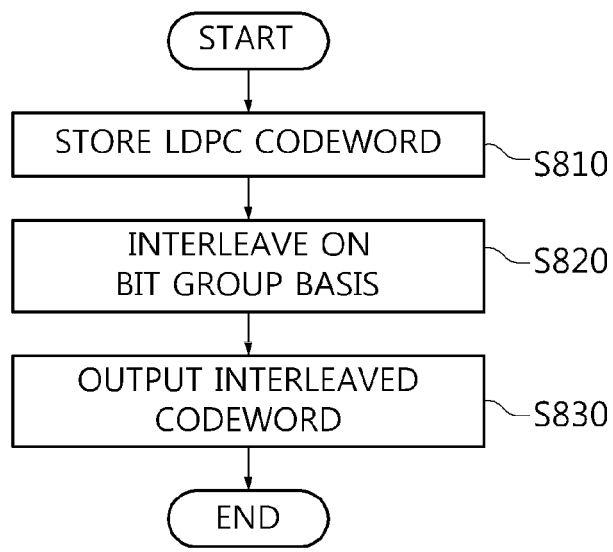
FIG. 8 is an operation flowchart illustrating a bit interleaving method according to an embodiment of the present invention.

FIG. 8 is an operation flowchart illustrating a bit interleaving method according to an embodiment of the present invention.

Referring to FIG. 8, in the bit interleaving method according to the present embodiment, an LDPC codeword having a length of 64800 and a code rate of 4/15 is stored at step S810.

In this case, the LDPC codeword may be represented by $(u_0, u_1, \ldots, u_{N_{ldpc}-1})$ (where $N_{ldpc}$ is 64800), and may be divided into 180 bit groups each composed of 360 bits, as in Equation 9.

Furthermore, in the bit interleaving method according to the present embodiment, an interleaved codeword is generated by interleaving the LDPC codeword on a bit group basis at step S820.

In this case, the size of the bit group may correspond to the parallel factor of the LDPC codeword.

In this case, the interleaving may be performed using Equation 10 using permutation order.

In this case, the permutation order may correspond to the interleaving sequence represented by Equation 11.

In this case, the parallel factor may be 360, and each of the bit groups may include 360 bits.

In this case, the LDPC codeword may be divided into 180 bit groups, as in Equation 9.

Moreover, in the bit interleaving method according to the present embodiment, the interleaved codeword is output to a modulator for QPSK modulation at step 830.

In accordance with at least one embodiment of the present invention, there is provided an intra-BICM bit interleaver that can effectively distribute burst errors occurring in a broadcasting system channel.

In accordance with at least one embodiment of the present invention, there is provided a bit interleaver that is optimized for an LDPC coder having a length of 64800 and a code rate of 4/15 and a QPSK modulator performing QPSK modulation and, thus, can be applied to next-generation broadcasting systems, such as ATSC 3.0.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A bit-interleaved coded modulation (BICM) reception device, comprising:
    a demodulator configured to perform demodulation corresponding to quadrature phase shift keying (QPSK) modulation;
    a bit deinterleaver configured to perform group-unit deinterleaving on interleaved values, the interleaved values generated after the demodulation; and
    a decoder configured to restore information bits by LDPC-decoding deinterleaved values generated based on the group-unit deinterleaving, the deinterleaved values corresponding to a LDPC codeword having a length of 64800 and a code rate of 4/15,
    wherein the group-unit deinterleaving is performed on a group basis, the size of the group corresponding to a parallel factor of the LDPC codeword,
    wherein the LDPC codeword is represented by $(u_0, u_1, \ldots, u_{N_{ldpc}-1})$ (where $N_{ldpc}$ is 64800), and is divided into 180 bit groups each including 360 bits before performing interleaving, as in the following equation:

$X_j = \{u_k | 360 \times j \leq k < 360 \times (j+1), 0 \leq k < N_{ldpc}\}$ for $0 \leq j < N_{group}$ where $X_j$ is a j-th bit group, $N_{ldpc}$ is 64800, and $N_{group}$ is 180,
    wherein the group-unit deinterleaving corresponds to a reverse process of the interleaving performed by using a permutation order, and
    the permutation order corresponds to an interleaving sequence represented by the following interleaving sequence:
    ={141 86 22 20 176 21 37 82 6 122 130 40 62 44 24 117
    8 145 36 79 172 149 127 163 9 160 73 100 16 153 124
    110 49 154 152 4 168 54 177 158 113 57 2 102 161 147
    18 103 1 41 104 144 39 105 131 77 69 108 159 61 45
    156 0 83 157 119 112 118 92 109 75 67 142 96 51 139
    31 166 179 89 167 23 34 60 93 165 128 90 19 33 70
    173 174 129 55 98 88 97 146 123 84 111 132 71 140
    136 10 115 63 46 42 50 138 81 59 53 15 52 72 164 150
    29 17 91 101 14 38 35 66 64 7 125 151 56 126 171 68
    121 28 65 106 78 47 143 12 169 120 27 74 48 133 43
    116 137 94 3 25 134 13 107 162 32 99 85 175 80 170
    5 135 178 11 26 76 95 87 155 58 30 148 114}.

2. The BICM reception device of claim 1, wherein the parallel factor is 360, and the group includes 360 values.

3. A bit-interleaved coded modulation (BICM) reception method, comprising:
    performing demodulation corresponding to quadrature phase shift keying (QPSK) modulation;
    performing group-unit deinterleaving on interleaved values, the interleaved values generated after the demodulation; and
    restoring information bits by LDPC-decoding deinterleaved values generated based on the group-unit deinterleaving, the deinterleaved values corresponding to a LDPC codeword having a length of 64800 and a code rate of 4/15,
    wherein the group-unit deinterleaving is performed on a group basis, the size of the group corresponding to a parallel factor of the LDPC codeword,
    wherein the LDPC codeword is represented by $(u_0, u_1, \ldots, u_{N_{ldpc}-1})$ (where $N_{ldpc}$ is 64800), and is divided into 180 bit groups each including 360 bits before performing interleaving, as in the following equation:

$X_j = \{u_k | 360 \times j \leq k < 360 \times (j+1), 0 \leq k < N_{ldpc}\}$ for $0 \leq j < N_{group}$ where $X_j$ is a j-th bit group, $N_{ldpc}$ is 64800, and $N_{group}$ is 180,
    wherein the group-unit deinterleaving corresponds to a reverse process of the interleaving performed by using a permutation order, and
    the permutation order corresponds to an interleaving sequence represented by the following interleaving sequence
    ={141 86 22 20 176 21 37 82 6 122 130 40 62 44 24 117
    8 145 36 79 172 149 127 163 9 160 73 100 16 153 124
    110 49 154 152 4 168 54 177 158 113 57 2 102 161 147
    18 103 1 41 104 144 39 105 131 77 69 108 159 61 45
    156 0 83 157 119 112 118 92 109 75 67 142 96 51 139
    31 166 179 89 167 23 34 60 93 165 128 90 19 33 70
    173 174 129 55 98 88 97 146 123 84 111 132 71 140
    136 10 115 63 46 42 50 138 81 59 53 15 52 72 164 150
    29 17 91 101 14 38 35 66 64 7 125 151 56 126 171 68
    121 28 65 106 78 47 143 12 169 120 27 74 48 133 43
    116 137 94 3 25 134 13 107 162 32 99 85 175 80 170
    5 135 178 11 26 76 95 87 155 58 30 148 114}.

* * * * *